(12) United States Patent
Den Boef (10) Patent No.: US 8,363,218 B2
(45) Date of Patent: Jan. 29, 2013

(54) INSPECTION METHOD AND APPARATUS, LITHOGRAPHIC APPARATUS, LITHOGRAPHIC PROCESSING CELL AND DEVICE MANUFACTURING METHOD

(75) Inventor: Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 290 days.

(21) Appl. No.: 12/727,389

(22) Filed: Mar. 19, 2010

(65) Prior Publication Data

US 2010/0265506 A1 Oct. 21, 2010

Related U.S. Application Data

(60) Provisional application No. 61/167,351, filed on Apr. 7, 2009.

(51) Int. Cl.
*G01B 11/00* (2006.01)
(52) U.S. Cl. .......................... 356/399; 356/401
(58) Field of Classification Search .......... 356/399–401
See application file for complete search history.

(56) References Cited

U.S. PATENT DOCUMENTS

| 7,599,064 | B2 * | 10/2009 | Mos et al. ............. 356/401 |
| 2006/0066855 | A1 | 3/2006 | Boef et al. |
| 2007/0229837 | A1 | 10/2007 | Schaar et al. |
| 2008/0212097 | A1 * | 9/2008 | Mos et al. ............. 356/400 |
| 2009/0073448 | A1 * | 3/2009 | Tenner et al. ............. 356/446 |

OTHER PUBLICATIONS

International Preliminary Report on Patentability and Written Opinion of the International Searching Authority directed to related International patent Application No. PCT/EP2010/053390, The International Bureau of WIPO, Geneva, Switzerland, mailed Mar. 16, 2010; 7 pages.
International Search Report directed to related International Patent Application No. PCT/EP2010/053390, the European Patent Office, Rijswijk, The Netherlands, mailed Jul. 13, 2010; 4 pages.
Anonymous, "Qualification of diffractive overlay measurements via asymmetry evaluation," *Research Disclosure*, Mason Publications, Hampshire, UK, ISSN 0374-4353 (Sep. 2008).

* cited by examiner

*Primary Examiner* — Tarifur Chowdhury
*Assistant Examiner* — Isiaka Akanbi
(74) *Attorney, Agent, or Firm* — Sterne, Kessler, Goldstein & Fox P.L.L.C.

(57) ABSTRACT

An overlay error between two successive layers produced by a lithographic process on a substrate is determined by using the lithographic process to form at least one periodic structure of a same pitch on each of the layers. One or more overlaid pairs of the periodic structures are formed in parallel, but offset relative to each other. A spectrum, produced by directing a beam of radiation onto the one or more pairs of periodic structures is measured. One or more portions of the spectrum are determined in which the relationship between the offset between the one or more pairs of periodic structures and the resultant variation in measured intensity of the spectrum at the one or more portions is more linear than the relationship outside the one or more portions. The offset between the one or more pairs of periodic structures on the basis of intensity measurements of the spectrum in the one or more portions of the spectrum is determined and used to determine the overlay error.

10 Claims, 7 Drawing Sheets

INSPECTION METHOD AND APPARATUS, LITHOGRAPHIC APPARATUS, LITHOGRAPHIC PROCESSING CELL AND DEVICE MANUFACTURING METHOD

CROSS REFERENCE TO RELATED APPLICATIONS

This application claims benefit under 35 U.S.C. §119(e) to U.S. Provisional Patent Application No. 61/167,351, filed Apr. 7, 2009, which is incorporated by reference herein in its entirety.

FIELD

The present invention relates to methods of inspection usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on the substrate. There are various techniques for making measurements of the microscopic structures formed in lithographic processes, including the use of scanning electron microscopes and various specialized tools. One form of specialized inspection tool is a scatterometer, in which a beam of radiation is directed onto a target on the surface of the substrate and properties of the scattered or reflected beam are measured. By comparing the properties of the beam before and after it has been reflected or scattered by the substrate, the properties of the substrate can be determined. The comparison can be done, for example, by comparing the reflected beam with data stored in a library of known measurements associated with known substrate properties. Two main types of scatterometer are known—spectroscopic and angularly resolved scatterometers. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

In order to measure the overlay error between two layers, it is known to provide the two layers with respective gratings or periodic structures. Any overlay errors are measured by measuring asymmetry in the reflected spectrum from the two overlaid gratings. The asymmetry is related to the extent of the overlay error, that is any offset between the two gratings. The asymmetry can be seen as a variation in the measured intensity of the reflected spectrum.

SUMMARY

It is desirable to provide a method of measuring overlay error, in which a relationship between a measured intensity signal of a reflected spectrum and an overlay error may be determined more accurately.

According to an embodiment of the present invention, there is provided a method of determining an overlay error between two successive layers produced by a lithographic process on a substrate comprising the following steps. Using the lithographic process to form at least one periodic structure of the same pitch on each of the layers, such that one or more overlaid pairs of the periodic structures are formed which are parallel, but offset relative to each other. Measuring a spectrum produced by directing a beam of radiation onto the one or more pairs of periodic structures. Determining one or more portions of the spectrum in which the relationship between the offset between the one or more pairs of periodic structures and the resultant variation in measured intensity of the spectrum at the one or more portions is more linear than the relationship outside the one or more portions. Determining the offset between the one or more pairs of periodic structures on the basis of intensity measurements of the spectrum in the one or more portions of the spectrum. Using the determined offset to determine the overlay error.

According to another embodiment of the present invention, there is provided an angularly resolved scatterometer configured to determine an overlay error between two successive layers produced by a lithographic apparatus on a substrate. The lithographic apparatus has been used to form at least one periodic structure of the same pitch on each of the layers, such that one or more overlaid pairs of the periodic structures are formed which are parallel, but are offset relative to each other. The scatterometer comprises a detector, a determination arrangement, and a computational arrangement. The detector is configured to detect a spectrum produced by directing a beam of radiation onto the one or more pairs of periodic structures. The determination arrangement is configured to determine one or more portions of the spectrum in which the relationship between the offset between the one or more pairs of periodic structures and the resultant variation in measured intensity of the spectrum at the one or more portions is more linear than the relationship outside the one or more portions. The computational arrangement is configured to calculate the offset between the one or more pairs of periodic structures on the basis of intensity measurements of the spectrum in the one or more portions of the spectrum and to use the determined offset to determine the overlay error.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

Overview

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
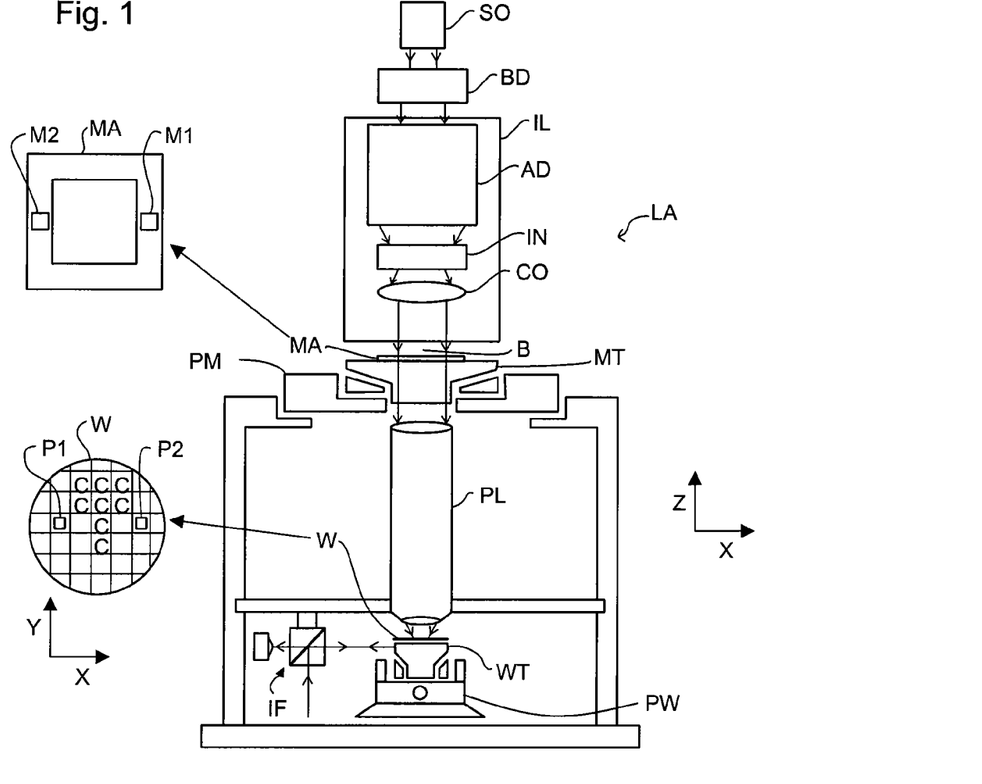
FIG. 1 depicts a lithographic apparatus.

FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features.

Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as □-outer and □-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1a) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

Figure 2:
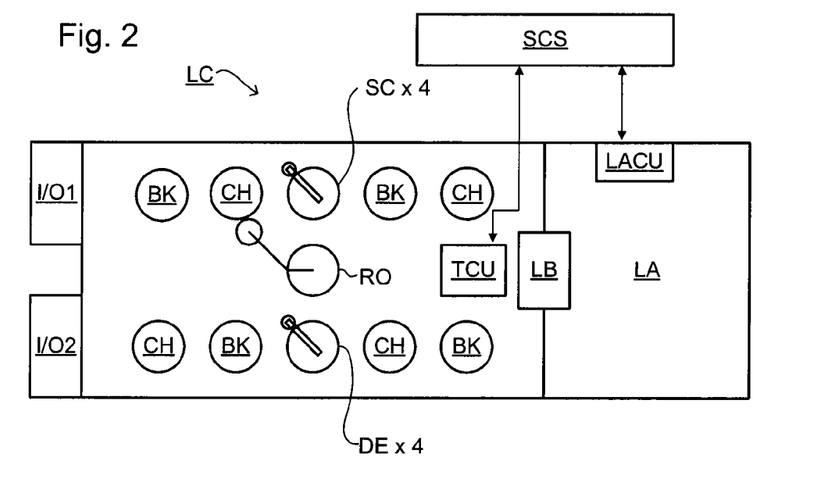
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
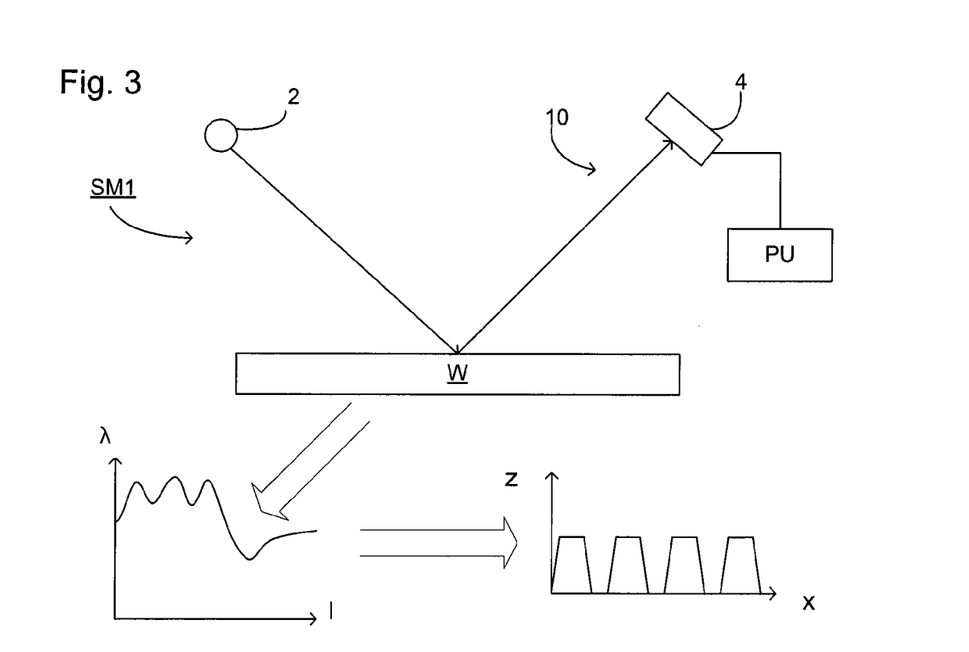
FIG. 3 depicts a first scatterometer.

FIG. 3 depicts a scatterometer that may be used in an embodiment of the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
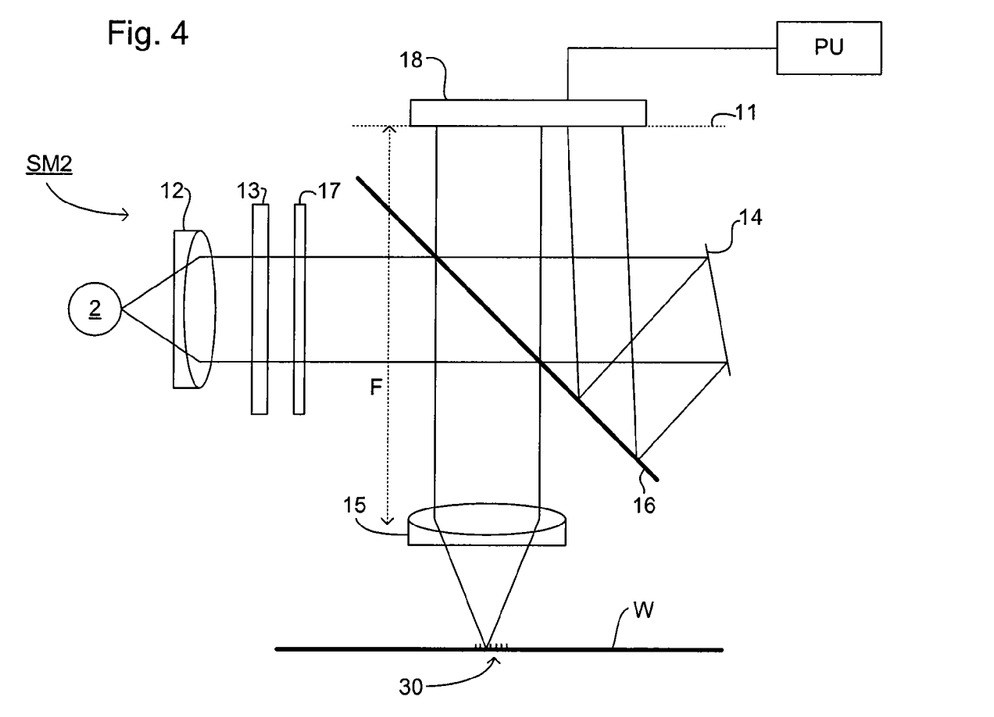
FIG. 4 depicts a second scatterometer.

Another scatterometer that may be used with an embodiment of the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of the substrate target can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of *8 and a spacing of at least 2*8 (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP 1,628,164A, which is incorporated by reference herein in its entirety.

The target on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

A relation between the intensity and the overlay error can be calibrated by imposing a small bias on the unknown overlay error. In particular two pairs of overlaid gratings are used, one grating on a first layer being shifted relative to the corresponding grating on the other layer in one direction, while the grating on the first layer is shifted relative to the corresponding grating on the other layer in the opposite direction. This technique is disclosed, for example, in the applicant's earlier application U.S. Published Patent Application No. 2006/0066855, the contents of which are hereby incorporated by reference. The measured intensity of the reflected spectrum varies periodically with the offset between the gratings in each pair of gratings, the period being equal to the grating pitch of the two gratings. It is known to be satisfactory to use a linear relationship between the intensity variation and the overlay error, where there are only small overlay errors in order to determine the overlay error from intensity variation measurements. A better approximation would be to assume a sinusoidal relationship as disclosed in U.S. Published Patent Application No. 2006/0066855. However, that there can be a second harmonic component as well, which may lead to errors in the overlay error measurement. While the effect of the second harmonic component can be reduced by adding extra gratings to calibrate for the effect of the second harmonic, this may consume extra space on the wafer.

In accordance with an embodiment of the present invention, there will now be described a method of measuring overlay errors in which the effect of the second harmonic on the relationship between the measured scatterometry spectrum and the overlay error is reduced by measuring the portion of the scatterometry spectrum in which the effect of second harmonic on the asymmetry in the scatterometry spectrum caused by the overlay error is reduced.

Figure 5:
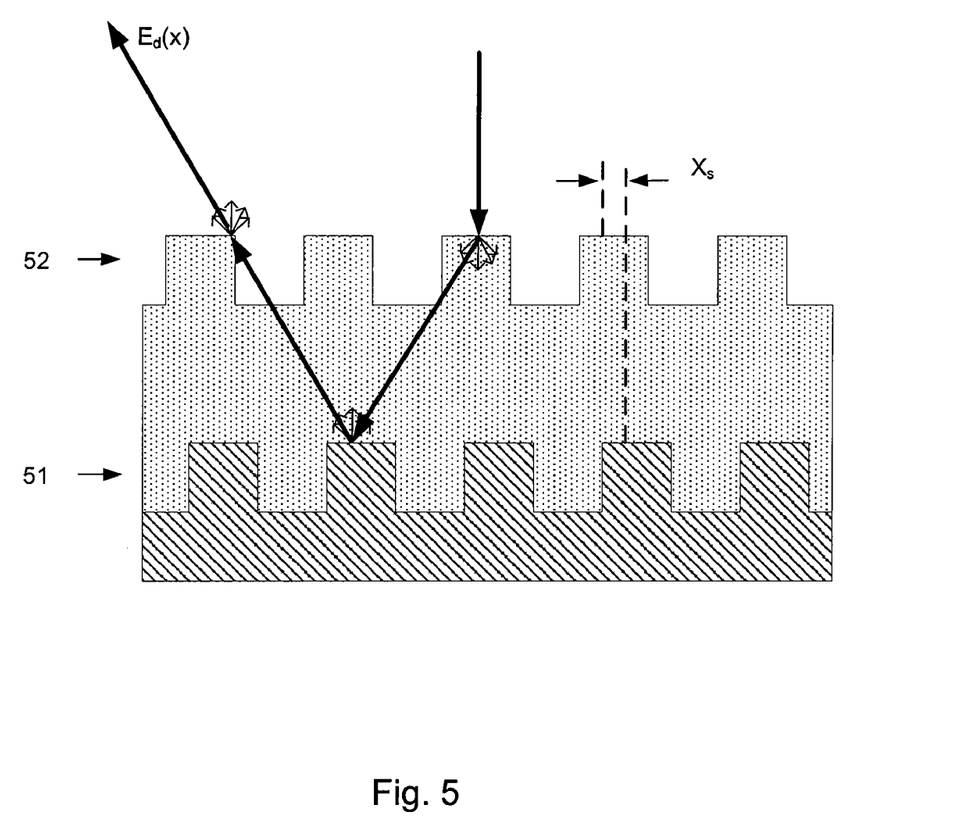
FIG. 5 depicts a resist grating formed on top of a product grating, for use in a method in accordance with an embodiment of the present invention.
Figure 6A:
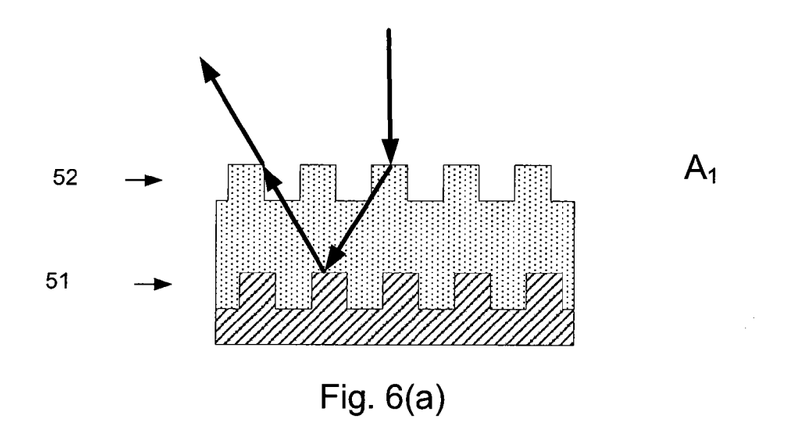
FIGS. 6(a), 6(b) and 6(c) depict a formation of three most dominant fields for a reflected spectrum formed by a radiation beam incident on gratings of FIG. 5.
Figure 6B:
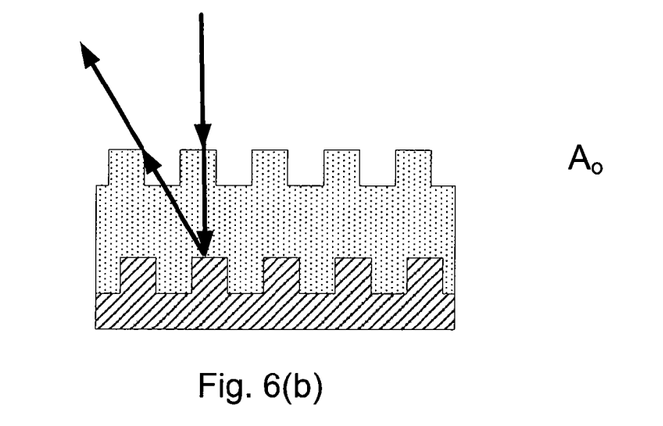
Figure 6C:
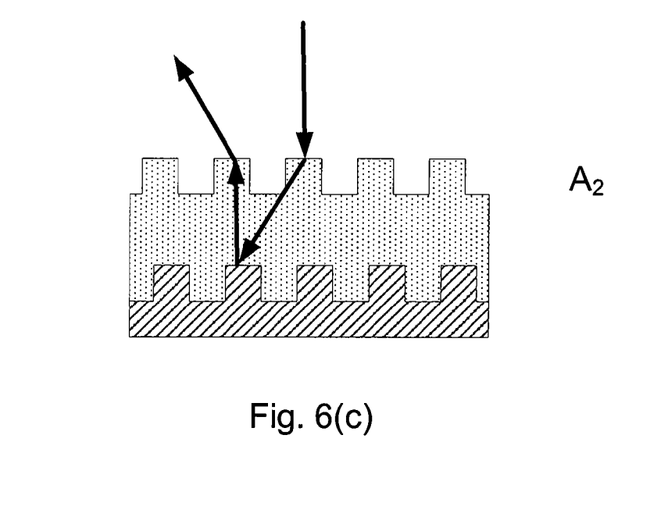

FIG. 5 depicts a resist grating formed on top of a product grating, for use in a method in accordance with an embodiment of the present invention. FIGS. 6(a), 6(b) and 6(c) depict a formation of three most dominant fields for a reflected spectrum formed by a radiation beam incident on gratings of FIG. 5.

Referring now to FIGS. 5 and 6, in an embodiment to be described, a product grating 51 is formed on the top of a product (not shown) on a wafer (also not shown), with a resist grating 52 formed over the product grating 51. The resist grating and the product grating have the same pitch but are displaced from each other along the x-axis by a distance Xs as shown in FIG. 5. It will be appreciated that, while in FIGS. 5 and 6 the gratings 51, 52 are relatively short, in practice the gratings can be relatively long such that the edge effects of the gratings are negligible.

Referring particularly to FIG. 5, the radiation incident on the top of the resist grating 52 will be diffracted by the resist grating 52 with the various diffraction orders, shown as a group of small arrows, being directed towards the product grating 51. At the product grating 51, radiation within each diffracted beam will be diffracted at a set of new diffraction orders that propagate towards the top of the resist grating 52, as indicated by the lower group of small arrows. The returning field will be diffracted again by the resist grating 52 as indicated by the third group of small arrows, to produce a resultant radiation field Ed(x) where x is the distance along the x axis, directed towards the sensor 4 of the scatterometer.

In one example, assuming that the product grating can be represented as r(x), while the resist grating can be represented as t(x−Xs), using scalar diffraction theory for the double diffraction at the resist grating and the single diffraction at the product grating, the desired sinusoidal term for variations in intensity of the measured diffraction pattern at the sensor 4 due to the misalignment Xs of the two gratings 51, 52 is determined by the addition of the field Ao shown in FIG. 6(b) and A1 shown in FIG. 6(a). As shown in FIG. 6(b), the field Ao is produced by: (i) T0 following the incidence of the radiation on the resist diffraction grating 52; (ii) R1 T0 at the diffraction at the product grating 51; and (iii) T0 R1 T0 at the resist grating 52. As shown in FIG. 6(a) the term: (i) A1 is determined by the T1 diffraction of the incident radiation on the resist grating 52, (ii) the R0 (directly reflected zero order) diffraction at the product grating 51; and (iii) T0 for the directly transmitted radiation at the exit of the radiation beam at the resist grating 52 to give the overall term T0 R0 T1.

It will be appreciated that, while only three fields A0, A1 and A2 are illustrated in FIGS. 6(a), (b), (c), in reality there can be more fields. However, these three fields are usually the most dominant. This then gives the desired sinusoidal term I1, where $$I_1 = T_0^2 T_1^2 R_0 R_1 \cos\left(\psi_{0,1} + 2\pi \frac{X_s}{P}\right)$$

ψ0,1 is the phase shift determined by the geometry of the two overlapping gratings 51,52 and the wavelength and the angle of incidence of the radiation and P is the pitch of the two gratings 51, 52.

A corresponding term for the intensity I−1 in the −1 direction can similarly be defined:

$$I_{-1} = T_0^2 T_{-1}^2 R_0 R_{-1} \cos\left(\psi_{0,1} - 2\pi \frac{X_s}{P}\right)$$

An undesired second harmonic term may be generated by the combination of the A0 field shown in FIG. 6(b) and the A2 term shown in FIG. 6(c). As indicated in FIG. 6(c) the incoming radiation produces a first order diffraction at the resist grating 52, a T−1 diffraction at the product grating 51, and a further T1 diffraction on exiting the resist grating 52, to appear in the first order direction at the exit beam generated by the term T1 R−1 T1. This then produces the undesired second harmonic term I2, where $$I_2 = T_0^2 T_1^2 R_{-1} R_1 \cos\left(\psi_{0,2} + 4\pi \frac{X_s}{P}\right)$$

Thus, while low harmonic distortion, that is a low value of the ratio, can be achieved where there is a low value of R−1, the value of R−1 will depend on the wavelength of the radiation, the angle of incidence, the azimuthal angle and the polarization of the radiation.

As the resist and product gratings 51, 52 are periodic they can be written as Fourier series as follows:

$$t(x - X_s) = \sum_{q=-\infty}^{\infty} T_q e^{-jq(x-X_s)K_x}$$

$$= \sum_{q=-\infty}^{\infty} T'_q e^{-jqxK_x}$$

$$r(x) = \sum_{m=-\infty}^{\infty} R_m e^{-jmxK_x}$$

where the Fourier coefficients Tq and Rm are essentially the complex amplitudes of the q-th and m-th diffraction orders. Thus, the diffracted field Ed(x) can be expressed at the product of three Fourier series $$E_d(x) = \sum_{n=-\infty}^{\infty} T'_p e^{-jnxK_x} \sum_{m=-\infty}^{\infty} R_m e^{-jmxK_x} \sum_{q=-\infty}^{\infty} T'_q e^{-jqxK_x}$$

Valuating the product of the above three summations indicates that the diffracted field Ed(x) can be expressed as the Fourier series $$E_p = A_{m1} + A_{m2}$$

$$E_d(x) = \sum_{p=-\infty}^{\infty} E_p e^{-jpxK_x}$$

where Ed(x) is the complex amplitude of the P diffraction order and is given by $$E_p = \sum_{m=-\infty}^{\infty} A_m e^{jmX_sK_x}$$

Figure 7:
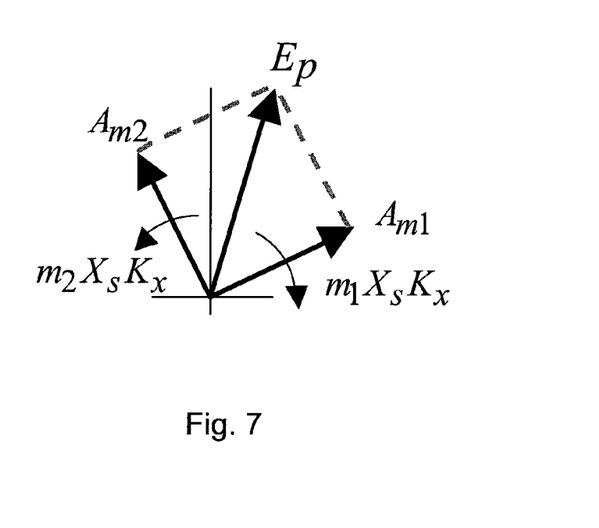
FIG. 7 illustrates a complex amplitude of a pth diffraction order formed from two of fields shown in FIGS. 6(a)-(c).

Referring now also to FIG. 7, the term Ep is the sum of phasers with amplitude Am and angle mXsKs, where m is the diffraction order as before.

FIG. 7 illustrates a complex amplitude of a pth diffraction order formed from two of fields shown in FIGS. 6(*a*)-(*c*). Thus in the example shown in FIG. 7, $$E_p = A_{m1} + A_{m2}$$

$$I_p = |A_{m1}|^2 + |A_{m2}|^2 + 2|A_{m1}||A_{m2}|\cos(\Psi_{m1,m2} + (m_1 - m_2)X_sK_x)$$

where the term (m1−m2) XsKs gives the overlay information.

The intensity variation as a function of shift between the resist and product grating in the +/−1 diffraction order is:

$$I_1 = B_1 \sin\left(\varphi_1 + 2\pi\frac{x}{P}\right) + B_2 \sin\left(\varphi_2 + 4\pi\frac{x}{P}\right)$$

$$I_{-1} = B_1 \sin\left(\varphi_1 - 2\pi\frac{x}{P}\right) + B_2 \sin\left(\varphi_2 - 4\pi\frac{x}{P}\right)$$

where B and φ are unknowns that depend on the stack and the position in the pupil plane. The difference between these intensities yields the asymmetry:

$$A = 2B_1 \cos(\varphi_1)\sin\left(2\pi\frac{x}{P}\right) + 2B_2 \cos(\varphi_2)\sin\left(4\pi\frac{x}{P}\right)$$

In one example, using two pairs of overlaid gratings 51, 52, one pair being displaced in a direction Xs=+d, the other pair being displaced by the amount Xs=−d, the overlay OV can be related to the respective intensity amplitudes A+, A− point in the measured scatterometry spectrum as follows:

$$OV = \frac{P}{2\pi} \operatorname{atan}\left[2\pi\frac{d}{P}\left(\frac{A_+ + A_-}{A_+ - A_-}\right)\right]$$

Figure 8:
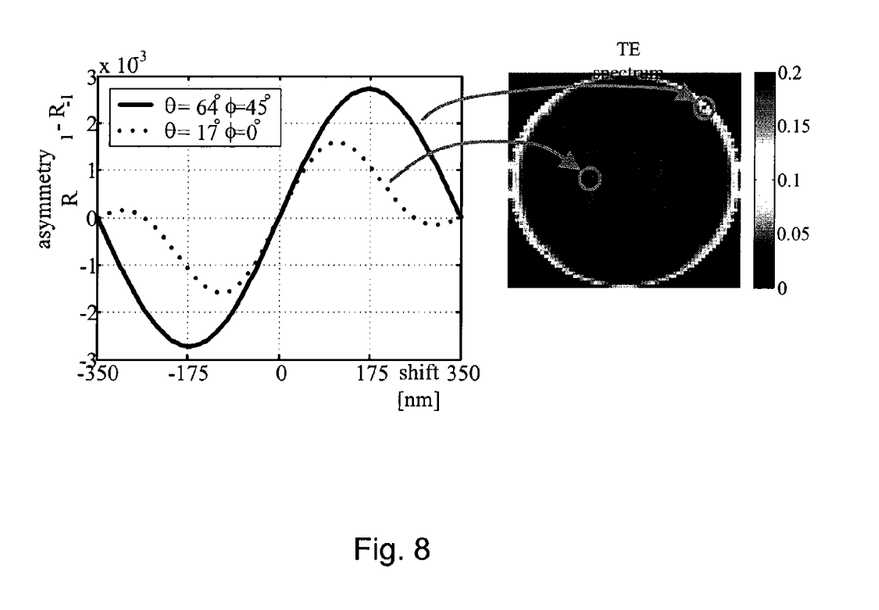
FIG. 8 depicts a formation of a second harmonic formed on a particular stack.

FIG. 8 depicts a formation of a second harmonic formed on a particular stack. FIG. 8 gives an example of how the second harmonic term can be observed on a particular product stack, in which the wavelength of the radiation is about 700 nm and the pitch of the gratings 51, 52 is also about 700 nm. In one example, the asymmetry can be traced to particular points on the measured spectrum shown on the right-hand side of FIG. 7. It is possible to reduce the effect of the second harmonic in the measured spectrum by choosing a particular window of the spectrum that correspond to pixels having a strong first harmonic contribution and a small second harmonic contribution. This will then give a good linearity in the relationship between the intensity variation and the overlay error.

Figure 9:
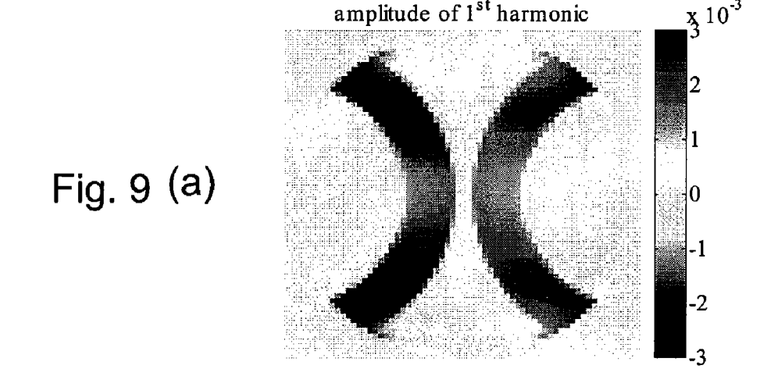
FIG. 9(a) depicts an amplitude of a first harmonic amplitude in a pupil plane formed by gratings of FIG. 5.
FIG. 9(b) depicts a corresponding amplitude of a second harmonic.
FIG. 9(c) depicts a value of R1 over a product grating.

FIG. 9(*a*) depicts an amplitude of a first harmonic amplitude in a pupil plane formed by gratings of FIG. 5. FIG. 9(*b*) depicts a corresponding amplitude of a second harmonic. FIG. 9(*c*) depicts a value of R1 over a product grating. FIG. 9 shows the harmonic amplitudes in the measured pupil plane originating from the first harmonic. FIG. 9(*b*) illustrates the amplitude of the second harmonic. The strength of the second harmonic is related to R1, the reflective coefficient of the product grating. FIG. 9(*c*) illustrates the value of R1 for the product grating calculated by removing the resist and all process layers in the simulation so as to obtain a reflective pattern from an oxide filled silicon grating.

Figure 10A:
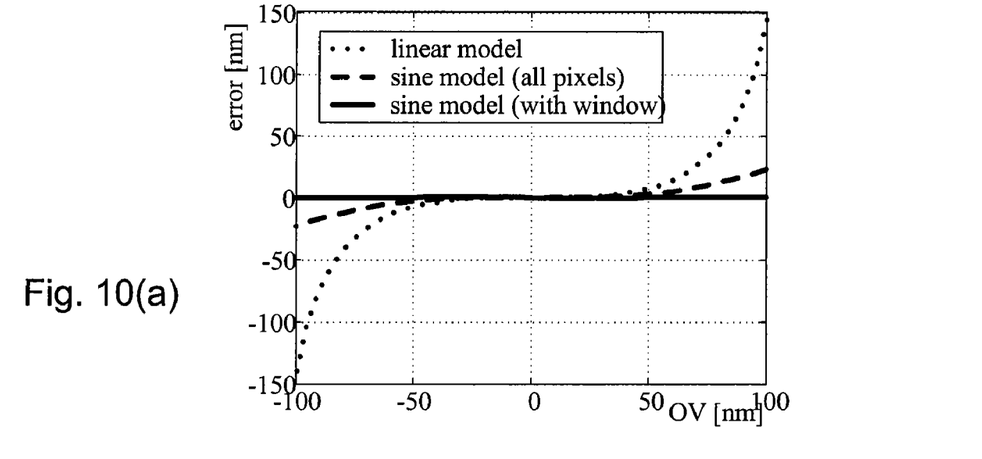
FIGS. 10(a) and 10(b) show a relationship between an overlay using a sine model either with all pixels of a pupil plane, or a window, compared with a linear model.
Figure 10B:
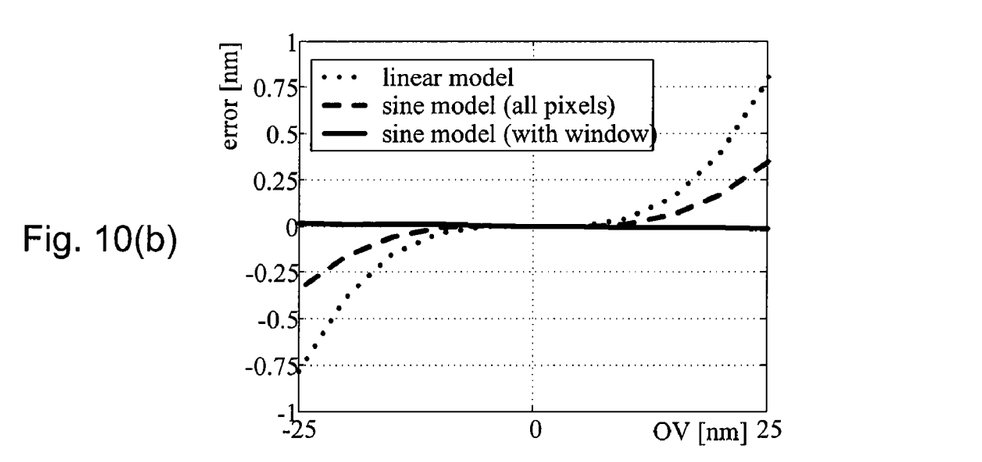
Figure 10C:
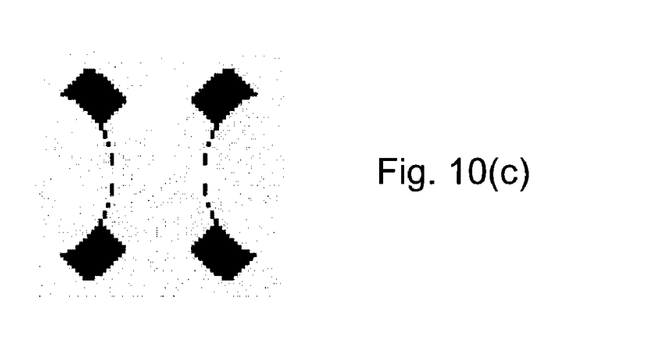
FIG. 10(c) illustrates a measurement window used in a pupil plane.

FIGS. 10(*a*) and 10(*b*) show a relationship between an overlay using a sine model either with all pixels of a pupil plane, or a window, compared with a linear model. FIG. 10(*c*) illustrates a measurement window used in a pupil plane. Referring now to FIG. 10, a simulation of the error in the overlay error as a function of the resultant variation in the measured intensity of the diffraction spectrum is shown using: 1. a linear model; 2. a sine model using all the pixels of the measured spectrum; and 3. a sine model using only the pixels which are shown to have a low second order harmonic.

The area shown to have the low second order harmonic is illustrated in FIG. 10(*c*). This can be particularly seen in FIG. 10(*b*), which shows the range of overlay error between about 0.00 and about 25 nm in more detail than the FIG. 10(*a*) plot, the response for the sine model using only pixels with low second harmonic showing a substantially zero error for all values of the overlay error.

It will be appreciated that while the above explanation has been given with respect to an example showing the first order diffraction, it is also applicable for spectroscopic inspection apparatuses using zero order diffraction. It will also be appreciated that while the embodiment of the invention has been described in terms of reducing the effect of the second harmonic, and thus is the most relevant term, the embodiment is also effective to reduce the effect of the other higher harmonics.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
using a lithographic process to form one or more overlaid pairs of periodic structures of a same pitch on each of two successive layers, wherein one or more of the overlaid pairs of the periodic structures are formed which are parallel, but offset relative to each other;
measuring a spectrum produced by directing a beam of radiation onto the one or more pairs of periodic structures;
determining one or more portions of the spectrum in which a relationship between the offset between the one or more pairs of the periodic structures and a resultant variation in measured intensity of the spectrum at the one or more portions is more linear than a relationship outside the one or more portions;
determining the offset between the one or more pairs of periodic structures based on intensity measurements of the spectrum in the one or more portions of the spectrum; and
using the determined offset to determine the overlay error.

2. The method of claim 1, wherein there are two of the overlaid pairs of periodic structures, each of the two of the pairs of overlaid structures having an offset between the two periodic structures in opposite directions.

3. The method of claim 1, wherein the measuring the spectrum comprises measuring +1st and −1st orders of a diffraction spectrum.

4. The method of claim 3, wherein:
a sinusoidal relationship of an asymmetry between intensities of the +1st and −1st orders of the diffraction spectrum is used to determine the offset; and
the one or more portions are chosen which minimize an effect of higher harmonics.

5. An angularly resolved scatterometer configured to determine an overlay error between two successive layers produced by a lithographic apparatus on a substrate, wherein the lithographic apparatus has been used to form at least one periodic structure of a same pitch on each of the layers, such that one or more overlaid pairs of the periodic structures are formed which are parallel, but are offset relative to each other, the scatterometer comprising:
a detector configured to detect a spectrum produced by directing a beam of radiation onto the one or more overlaid pairs of the periodic structures;

a determination arrangement configured to determine one or more portions of the spectrum in which a relationship between the offset between the one or more pairs of the periodic structures and a resultant variation in measured intensity of the spectrum at the one or more portions is more linear than a relationship outside the one or more portions; and a computational arrangement configured to calculate the offset between the one or more pairs of the periodic structures based on intensity measurements of the spectrum in the one or more portions of the spectrum and to use the calculated offset to determine the overlay error.

6. The scatterometer according to claim 5, wherein there are two of the overlaid pairs, each of the two of the pairs having an offset between the periodic structures in opposite directions.

7. The scatterometer according to claim 5, wherein the spectrum is a diffraction spectrum and +1st and −1st orders of the diffraction spectrum are measured.

8. The scatterometer according to claim 7, wherein:
a sinusoidal relationship of an asymmetry between intensities of the +1st and −1st orders of the diffraction spectrum is used to determine the offset; and
the one or more portions of the spectrum are chosen that minimize an effect of higher harmonics.

9. A lithographic apparatus comprising:
an illumination optical system arranged to illuminate a pattern;
a projection optical system arranged to project an image of the pattern on to a substrate; and
an angularly resolved scatterometer configured to determine an overlay error between two successive layers produced by a lithographic apparatus on a substrate, wherein the lithographic apparatus has been used to form at least one periodic structure of a same pitch on each of the layers, such that one or more overlaid pairs of the periodic structures are formed which are parallel, but are offset relative to each other, the scatterometer comprising,
  a detector configured to detect a spectrum produced by directing a beam of radiation onto the one or more overlaid pairs of the periodic structures,
  a determination arrangement configured to determine one or more portions of the spectrum in which a relationship between the offset between the one or more pairs of the periodic structures and a resultant variation in measured intensity of the spectrum at the one or more portions is more linear than a relationship outside the one or more portions, and
  a computational arrangement configured to calculate the offset between the one or more pairs of the periodic structures based on intensity measurements of the spectrum in the one or more portions of the spectrum and to use the calculated offset to determine the overlay error.

10. A lithographic cell comprising:
a coater arranged to coat substrates with a radiation sensitive layer;
a lithographic apparatus arranged to expose images onto the radiation sensitive layer of substrates coated by the coater;
a developer arranged to develop images exposed by the lithographic apparatus; and
a scatterometer configured to determine an overlay error between two successive layers produced by a lithographic apparatus on a substrate, wherein the lithographic apparatus has been used to form at least one periodic structure of a same pitch on each of the layers, such that one or more overlaid pairs of the periodic structures are formed which are parallel, but are offset relative to each other, the scatterometer comprising,
  a detector configured to detect a spectrum produced by directing a beam of radiation onto the one or more overlaid pairs of the periodic structures,
  a determination arrangement configured to determine one or more portions of the spectrum in which a relationship between the offset between the one or more pairs of the periodic structures and a resultant variation in measured intensity of the spectrum at the one or more portions is more linear than a relationship outside the one or more portions, and
  a computational arrangement configured to calculate the offset between the one or more pairs of the periodic structures based on intensity measurements of the spectrum in the one or more portions of the spectrum and to use the calculated offset to determine the overlay error.

* * * * *